(12) United States Patent
Brennan

(10) Patent No.: US 8,508,047 B2
(45) Date of Patent: Aug. 13, 2013

(54) BURIED WORD LINE MEMORY INTEGRATED CIRCUIT SYSTEM

(75) Inventor: Michael Brennan, Campbell, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 11/550,406

(22) Filed: Oct. 17, 2006

(65) Prior Publication Data

US 2007/0091684 A1    Apr. 26, 2007

Related U.S. Application Data

(62) Division of application No. 11/045,694, filed on Jan. 27, 2005, now Pat. No. 7,141,838.

(51) Int. Cl.
*H01L 23/48* (2006.01)

(52) U.S. Cl.
USPC .......... 257/758; 257/241; 257/287; 257/315; 257/324; 257/E21.423; 257/E21.679; 257/E27.103; 257/E29.309

(58) Field of Classification Search
USPC .......... 257/315, 241, 287, 324, 758, E21.423, 257/E21.679, E27.103, E29.309
See application file for complete search history.

(56) References Cited

U.S. PATENT DOCUMENTS

| | | | |
|---|---|---|---|
| 5,909,618 A | 6/1999 | Forbes et al. | |
| 5,936,274 A * | 8/1999 | Forbes et al. | 257/315 |
| 6,072,209 A | 6/2000 | Noble et al. | |
| 6,399,979 B1 | 6/2002 | Noble et al. | |
| 6,448,607 B1 * | 9/2002 | Hsu et al. | 257/315 |
| 6,754,105 B1 * | 6/2004 | Chang et al. | 365/185.18 |

* cited by examiner

*Primary Examiner* — Andy Huynh
(74) *Attorney, Agent, or Firm* — Sterne, Kessler, Goldstein & Fox P.L.L.C.

(57) ABSTRACT

An integrated circuit system includes providing a semiconductor substrate and forming buried word lines in the semiconductor substrate with the buried word lines including vertical charge-trapping dielectric layers. The system further includes forming bit lines further comprising forming in-substrate portions in the semiconductor substrate, and forming above-substrate portions over the semiconductor substrate.

10 Claims, 4 Drawing Sheets

__US 8,508,047 B2__

BURIED WORD LINE MEMORY INTEGRATED CIRCUIT SYSTEM

CROSS-REFERENCE TO RELATED APPLICATION(S)

This is a divisional of U.S. patent application Ser. No. 11/045,694 filed Jan. 27, 2005, now U.S. Pat. No. 7,141,838.

BACKGROUND OF THE INVENTION

1. Technical Field

The present invention relates generally to semiconductor technology and more specifically to flash memory.

2. Background Art

Various types of memories have been developed in the past as electronic memory media for computers and similar systems. Such memories include electrically erasable programmable read only memory (EEPROM) and electrically programmable read only memory (EPROM). Each type of memory had advantages and disadvantages. EEPROM can be easily erased without extra exterior equipment but with reduced data storage density, lower speed, and higher cost. EPROM, in contrast, is less expensive and has greater density but lack erasability.

A newer type of memory called "Flash" EEPROM, or Flash memory, has become extremely popular because it combines the advantages of the high density and low cost of EPROM with the electrical erasability of EEPROM. Flash memory can be rewritten and can hold its contents without power. It is used in many portable electronic products, such as cell phone, portable computers, voice recorders, etc. as well as in many larger electronic systems, such as cars, planes, industrial control systems, etc.

In Flash memory, bits of information are programmed individually as in the older types of memory, such as dynamic random access memory (DRAM) and static random access memory (SRAM) memory chips. However, in DRAMs and SRAMs where individual bits can be erased one at a time, Flash memory must currently be erased in fixed multi-bit blocks or sectors.

Conventionally, Flash memory is constructed of many Flash memory cells where a single bit is stored in each memory cell and the cells are programmed by hot electron injection and erased by Fowler-Nordheim tunneling. However, increased market demand has driven the development of Flash memory cells to increase both the speed and the density. Newer Flash memory cells have been developed that allow more than a single bit to be stored in each cell.

One memory cell structure involves the storage of more than one level of charge to be stored in a memory cell with each level representative of a bit. This structure is referred to as a multi-level storage (MLS) architecture. Unfortunately, this structure inherently requires a great deal of precision in both programming and reading the differences in the levels to be able to distinguish the bits. If a memory cell using the MLS architecture is overcharged, even by a small amount, the only way to correct the bit error would be to erase the memory cell and totally reprogram the memory cell. The need in the MLS architecture to precisely control the amount of charge in a memory cell while programming also makes the technology slower and the data less reliable. It also takes longer to access or "read" precise amounts of charge. Thus, both speed and reliability are sacrificed in order to improve memory cell density.

An even newer technology allowing two bits (dual bits) to be stored in a single cell, known as a dual bit or MirrorBit®, has been developed. In this technology, a memory cell is essentially split into two identical (mirrored) parts, each of which is formulated for storing one of two independent bits. Each dual bit Flash memory cell, like a traditional Flash cell, has a gate with a source and a drain. However, unlike a traditional Flash cell in which the source is always connected to an electrical source and the drain is always connected to an electrical drain, each dual bit Flash memory cell can have the connections of the source and drain reversed during operation to permit the storing of two bits.

The dual bit Flash memory cell has a semiconductor substrate with implanted conductive bit lines. A charge storage layer is formed over the semiconductor substrate. Word lines are formed over the charge storage layer perpendicular to the bit lines and a dielectric layer is deposited.

As the pitch of the bit lines and word lines reach the limits of manufacturability, the limits of data storage capability are also being reached and the data storage density apparently cannot be further increased.

A solution to this problem has been long sought but has long eluded those skilled in the art.

DISCLOSURE OF THE INVENTION

The present invention includes providing a semiconductor substrate and forming buried word lines in the semiconductor substrate with the buried word lines including vertical charge-trapping dielectric layers. The system further includes forming bit lines further comprising forming in-substrate portions in the semiconductor substrate, and forming above-substrate portions over the semiconductor substrate.

The above and additional advantages of the present invention will become apparent to those skilled in the art from a reading of the following detailed description when taken in conjunction with the accompanying drawings.

BEST MODE FOR CARRYING OUT THE INVENTION

Figure 1:
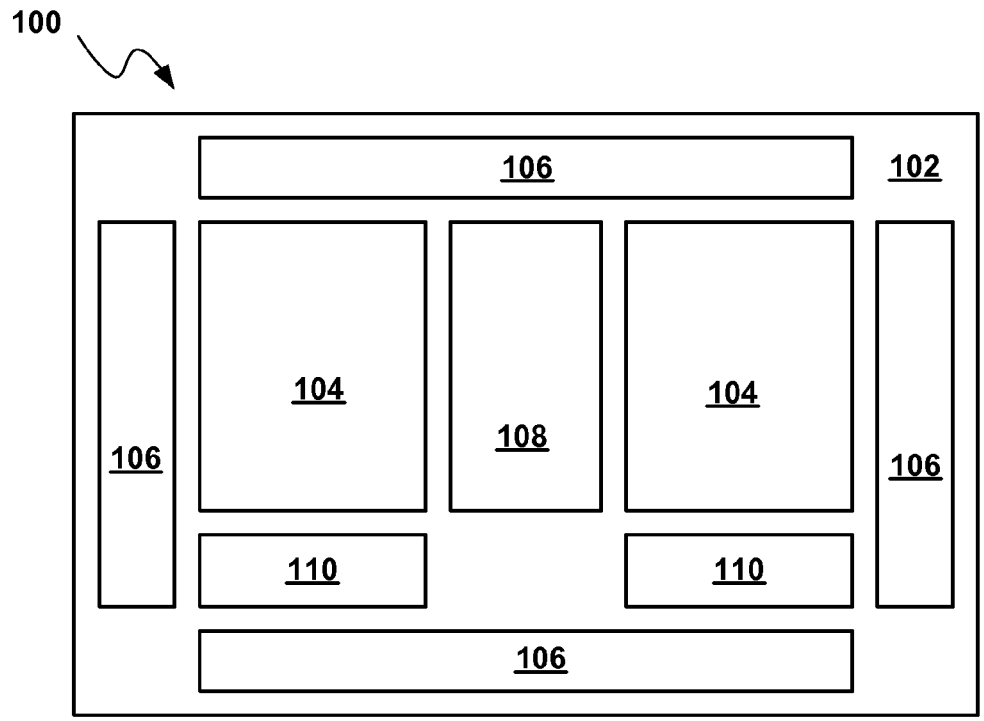
FIG. 1 is a plan view of a multiple dual bit memory integrated circuit system in accordance with an embodiment of the present invention.

In the following description, numerous specific details are given to provide a thorough understanding of the invention. However, it will be apparent to one skilled in the art that the invention may be practiced without these specific details. In order to avoid obscuring the present invention, some well-known circuits, system configurations, and processing steps are not disclosed in detail. Likewise, the drawings showing embodiments of the invention are semi-diagrammatic and not to scale and, particularly, some of the dimensions are for the clarity of presentation and are shown exaggerated in the FIGs. In addition, where multiple embodiments are disclosed and described having some features in common, for clarity and ease of illustration, description, and comprehension thereof, similar and like features one to another will ordinarily be described with like reference numerals.

Referring now to FIG. 1, is a plan view of a multiple dual bit memory integrated circuit system 100 in accordance with an embodiment of the present invention. The multiple dual bit memory integrated circuit system 100 includes a semiconductor substrate 102 in which one or more high-density core regions and one or more low-density peripheral portions are formed. High-density core regions typically include one or more M×N array core regions 104 of individually addressable, substantially identical Flash memory cell systems.

Low-density peripheral portions typically include input/output (I/O) circuitry and programming circuitry for selectively addressing the individual memory cells. The programming circuitry is represented in part by and includes one or more x-decoders 108 and y-decoders 110, cooperating with I/O circuitry 106 for connecting the source, gate, and drain of selected addressed memory cells to predetermined voltages or impedances to effect designated operations on the memory cell, e.g., programming, reading, and erasing, and deriving necessary voltages to effect such operations.

The term "horizontal" as used in herein is a plane parallel to the conventional plane or surface the semiconductor substrate 102 regardless of its orientation. The term "vertical" refers to a direction perpendicular to the horizontal as just defined. Terms, such as "above", "below", "higher", "lower", "over", "under", "side" and "beside", are relative to these horizontal and vertical planes. The term "on" as used with a layer being "on" another layer indicates contact between the layers regardless of whether the layers are vertical or horizontal. The term "processed" as used herein is defined to include one or more of the following: depositing or growing semiconductor materials, masking, patterning, photolithography, etching, implanting, removal, and/or stripping.

The term "dual bit locations" as used herein are locations where two bits of data are capable of being stored in a charge-trapping material on either side of a conductive region, which is not in the charge-trapping material, where the charges representing the data are capable of being independently written to or read.

Figure 2:
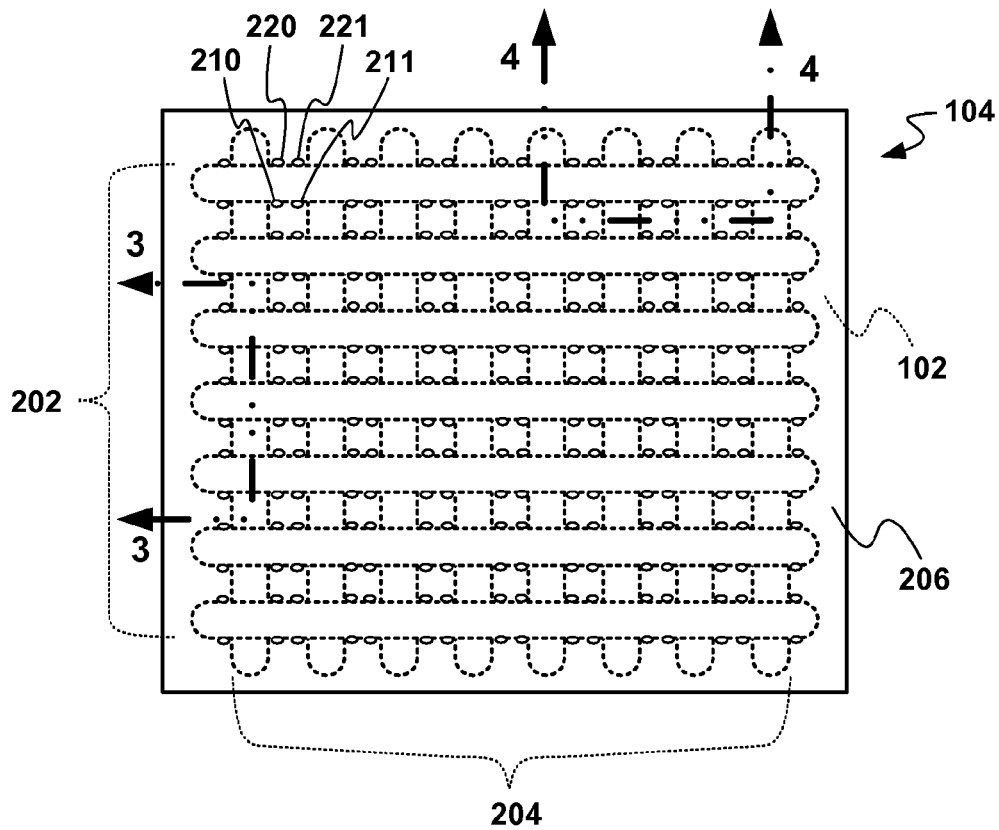
FIG. 2 is a plan view of a portion of one of the M×N array cores in accordance with the embodiment of the present invention of FIG. 1.

Referring now to FIG. 2, therein is shown a plan view of a portion of one of the M×N array core regions 104 in accordance with the embodiment of the present invention of FIG. 1. The semiconductor substrate 102 is of a semiconductor material such as single crystal silicon and may be lightly doped. The semiconductor substrate 102 has parallel conductive word lines 202 and parallel conductive bit lines 204 extending at right angles to the conductive word lines 202 in a dielectric layer 206. The conductive word lines 202 and conductive bit lines 204 have contacts and interconnections (not shown) to the programming circuitry represented in part by the x-decoders 108 and the y-decoders 110 of FIG. 1. The generic term "address lines" describes both bit and word lines.

In one embodiment, the semiconductor substrate 102 is of p-doped silicon. The conductive word lines 202 are of dielectric surrounded polyamorphous silicon (polysilicon). The conductive bit lines 204 are of n-doping in the semiconductor substrate 102 with polysilicon above the semiconductor substrate 102 in a dielectric layer 206 having silicide above the polysilicon. The p-doping can be performed using boron and the n-doping using arsenic.

In one embodiment of the present invention, it has been discovered that the conductive word lines 202 in the semiconductor substrate 102 permit multiple additional bit locations. This means that storage density cannot only be increased, but it can be increased in multiples of the previous technology. The M×N array core regions 104 have dual bit locations 210 and 211 and further dual bit locations 220 and 221. Thus, the multiple dual bit memory integrated circuit system 100 will have at least twice the memory capacity of previous memory systems with the same bit line and word line pitch (and may be higher since bit line contacts are not required). The actual total increase in storage density depends on the relative pitches of the word lines and bit lines.

Programming circuitry controls two bits per cell by applying a signal to the word line, which acts as a control gate, and changing bit line connections such that one bit is stored by source and drain being connected in one arrangement and a complementary bit is stored by the source and drain being interchanged in another arrangement.

Programming of the cell is accomplished in one direction and reading is accomplished in a direction opposite that in which it is programmed.

Figure 3:
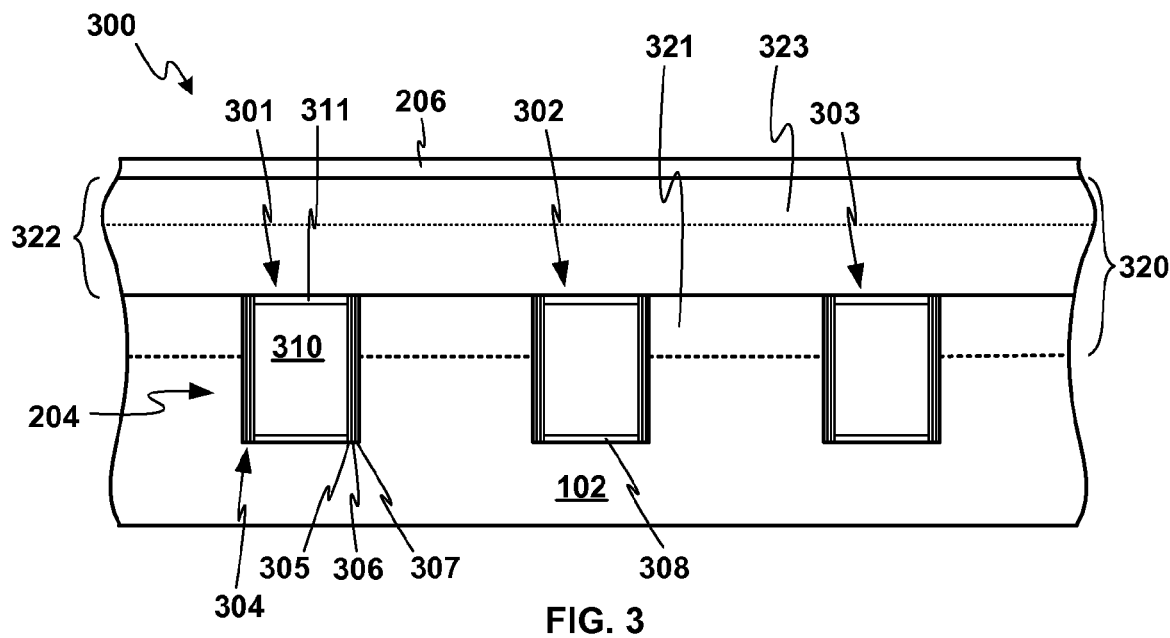
FIG. 3 is a cross-sectional view of a number of memory cells along line 3-3 in FIG. 2.

Referring now to FIG. 3, therein is shown a cross-sectional view of a number of memory cells 300 along line 3-3 in FIG. 2. The semiconductor substrate 102 has the conductive word lines 202, such as word lines 301 through 303.

In one embodiment, each of the conductive word lines 202, such as the word line 301, has charge-trapping dielectric layers 304 deposited vertically on the two sidewalls of a trench in the semiconductor substrate 102. The charge-trapping dielectric layers 304 can be a single layer or can be composed of three separate layers: a first insulating layer 305, a charge-trapping layer 306, and a second insulating layer 307. The first and second insulating layers 305 and 307 are of an oxide dielectric, such as silicon dioxide ($SiO_2$), and the charge-trapping layer 306 is of a nitride dielectric, such as silicon nitride ($Si_xN_y$). The oxide-nitride-oxide configuration is referred to as a matter of convenience as "ONO".

In addition to an ONO layer memory stack, any charge storage memory stack could be used in alternative embodiments of the present invention. For example, floating-gate architecture could be used in an alternative embodiment by depositing a thin dielectric layer on the sidewall of the trench, followed by the floating gate being fabricated vertically on the thin dielectric layer. Next would come deposition of another vertical dielectric layer followed by filling the remaining trench with the gate/word line material.

Each of the word lines, such as the word line 301, has a dielectric layer 308 such as an oxide formed on the bottom of the trench in the semiconductor substrate 102 between the charge-trapping dielectric layers 304. A polysilicon layer 310 is deposited within the charge-trapping dielectric layers 304. A barrier dielectric layer 311, such as an oxide barrier, is formed over the polysilicon layer between the charge-trapping dielectric layers 304. The top of the barrier dielectric layer 311 is coplanar with the top surface of the semiconductor substrate 102.

The structure of the polysilicon layer 310 within the charge-trapping layer 304 topped by the barrier dielectric layer 311 defines the buried word line 301. Thus, the conductive word lines 202 are defined as being buried in the semiconductor substrate 102.

Extending perpendicular to the conductive word lines 202 are the conductive bit lines 204 of FIG. 2 of which a bit line 320 is shown. In one embodiment, the bit line 320 comprises an in-substrate portion 321 in the semiconductor substrate 102 and an above-substrate portion 322 on the semiconductor substrate 102 in the dielectric layer 206. In one embodiment, the in-substrate portion 321 is implanted and the above-substrate portion 322 is made of conductive polysilicon with a silicide 323.

Figure 4:
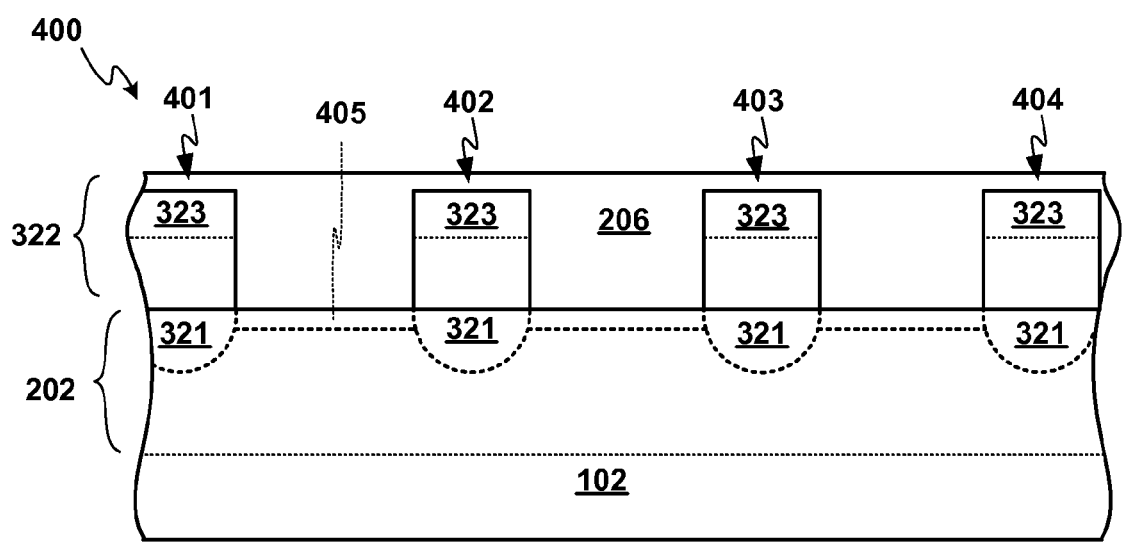
FIG. 4 is a cross-sectional view of a number of memory cells along line 4-4 in FIG. 2.

Referring now to FIG. 4, therein is shown a cross-sectional view of a number of memory cells 400 along line 4-4 in FIG. 2. The semiconductor substrate 102 and the dielectric layer 206 contain the conductive bit lines 204, such as the bit lines 401 through 404. The conductive bit lines 204 are formed such that the channel of the memory transistor of one of the memory cells 400 runs along the sidewall of the trench parallel to the charge-trapping dielectric layer 304.

It should be noted that particulars regarding the fabrication of the conductive bit lines 204 is not necessary in order to properly describe the present invention. There exist many methods by which bit lines could be fabricated (another example of a method to make the bit lines is by etching trenches in the crystalline silicon region and using selective epitaxial growth to fill the holes with doped silicon).

Each of the bit lines, such as the bit line 401, has the in-substrate portion 321 in the semiconductor substrate 102 and the above-substrate portion 322 in the dielectric layer 206. The conductive bit lines 204 can be formed at or near the surface of the semiconductor substrate 102 after the conductive word lines 202 have been formed. This means that there is a reduction in the number of critical masking steps because a separate a bit line mask and a bit line contact mask are not required.

Each cell is identical to every other cell, minimizing detrimental effects that may arise due to having some cells next to a contact or next to a space.

Reduction in array area (or further increase in storage density) is possible due to the fact that a space does not need to be left after every X number of word lines for bit line contact holes.

The present invention also provides a larger process window for fabrication of the word lines. At small dimensions, isolated or semi-isolated lines are typically the process limiters. By not having spaces for contact holes, the only word lines that are semi-isolated are the two word lines at the edges of the array. Two dummy word lines can be positioned at each end such that the process window for the core array is that optimized for dense lines.

Since bit lines are formed last (after the word lines), they may see less thermal cycling. This enables the dimensions to be scaled much more easily compared with the conventional architecture.

The semiconductor substrate 102 also has a threshold adjustment implant 405. The threshold adjustment implant 405 provides a region that is more heavily doped than the semiconductor substrate 102 itself and assists in the control of the threshold voltage of the memory cells and the formation of conductive channels on the sides of the conductive word lines 202.

It has been discovered that for a given area, a larger storage density is obtainable. Further, the entire memory system can be scaled downward by conventional methods such as reducing word line and/or bit line width.

Figure 5:
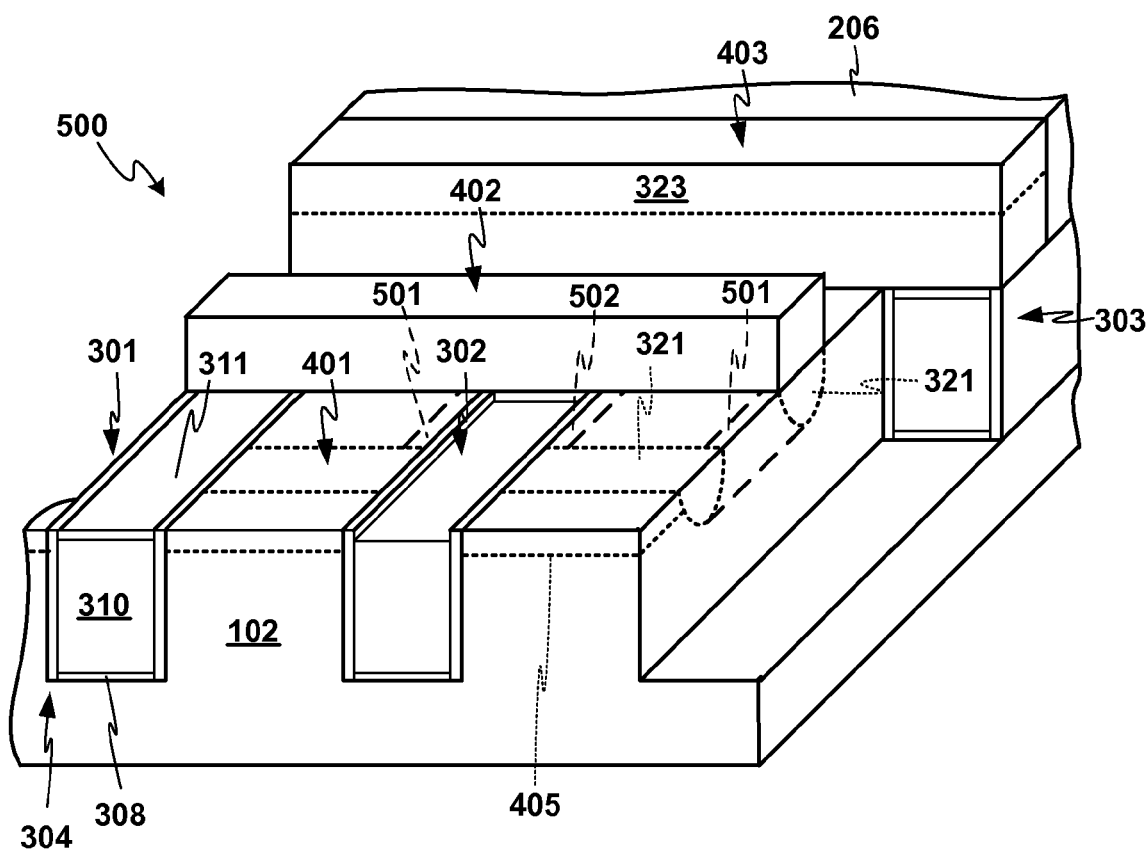
FIG. 5 is an isometric view of a number of memory cells in accordance with the embodiment of the present invention.

Referring now to FIG. 5, therein is shown an isometric view of a number of memory cells 500 in accordance with the embodiment of the present invention. The semiconductor substrate 102 is capable of forming conductive channels such as the conductive channels 501 and 502 shown between the bit lines 401 and 402 that are adjacent the charge-trapping dielectric layers 304 of the word lines 302 and 303.

The present invention can be operated in either a single-density mode or a double-density mode.

Figure 6:
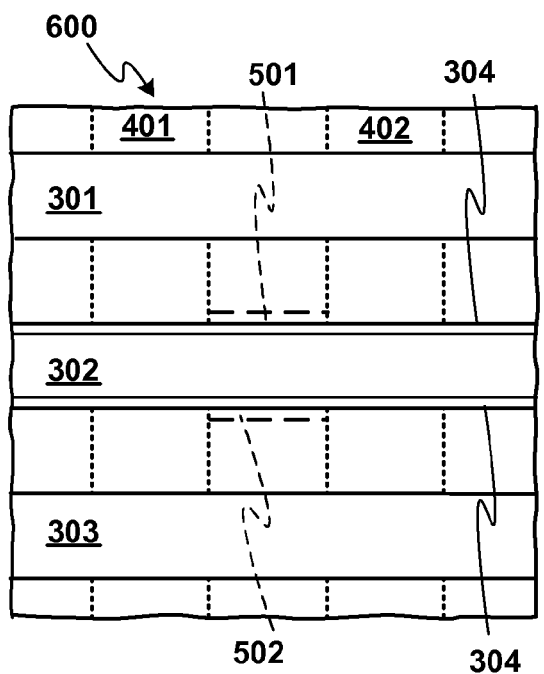
FIG. 6 is a simplified plan view of one of the memory cells operating in a single-density mode.

Referring now to FIG. 6, therein is shown a simplified plan view of one of the memory cells 600 operating in a single-density mode.

Applying a voltage to the word line 302 induces the conductive channels 501 and 502 on the sides of the word line 302 in FIG. 6, provided that the applied voltage (V) exceeds the threshold voltage (Vt) of the memory transistor formed by the word line 302 and the bit lines 401 and 402. Operating the memory transistor in this capacity may offer advantages in terms of reliability since programmed/erased bits are mirrored in the charge-trapping dielectric layers 304 forming the sides of the word line 302 and conduction takes place in both of the conductive channels 501 and 502, effectively doubling the 'width' of the channel over the previous single channel.

Figure 7:
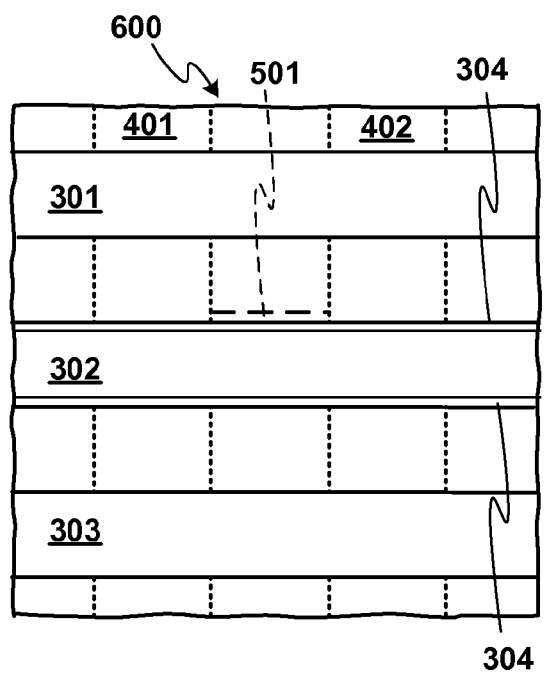
FIG. 7 is a simplified plan view of one of the memory cells operating in a double-density mode.

Referring now to FIG. 7, therein is shown a simplified plan view of one of the memory cells 600 operating in a double-density mode.

The difference between double-density mode of operation and the single-density mode is that a non-zero voltage is applied to an adjacent word line such as the word line 303. The non-zero voltage results in a change in the threshold voltage of the memory transistor having the conductive channel 501. Where the threshold voltage of the memory transistor having the conductive channel 501 is defined as $V_{t501}$ and the threshold of the memory transistor having the conductive channel 502 (shown in FIG. 7) is defined as $V_{t502}$, and the voltage V applied to the word line 302 is such that $V_{t501} < V < V_{t502}$, only the conductive channel 501 will be open. The voltage applied to the word line 301 is preferably around zero volts (although it may be at almost any voltage as long as the $V_{t501} < V < V_{t502}$ relationship is maintained). By reversing the threshold voltage levels, each conductive channel 501 or 502 can be addressed independently from one another, effectively doubling the storage density of the memory cells 600.

Figure 8:
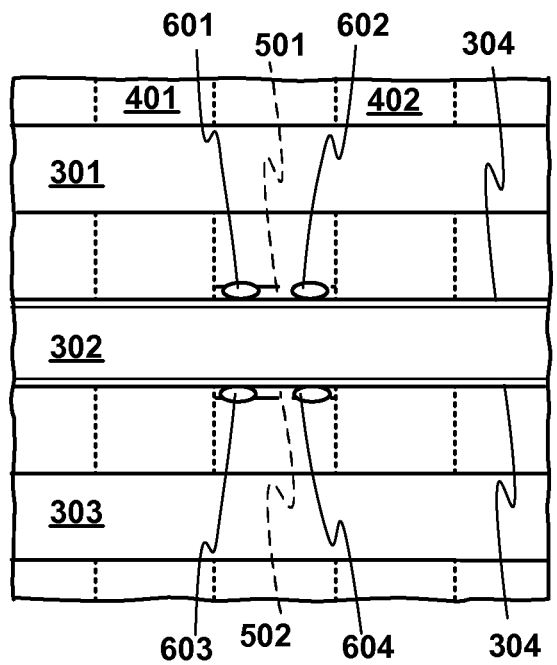
FIG. 8 is a simplified plan view of one of the memory cells operating in a multiple-dual bit mode.

Referring now to FIG. 8, therein is shown a simplified plan view of one of the memory cells 600 operating in a multiple-dual bit mode. By controlling the two threshold voltages and interchanging two bit line sources and drains, bit locations 601 through 604 can be individually written to and read.

Figure 9:
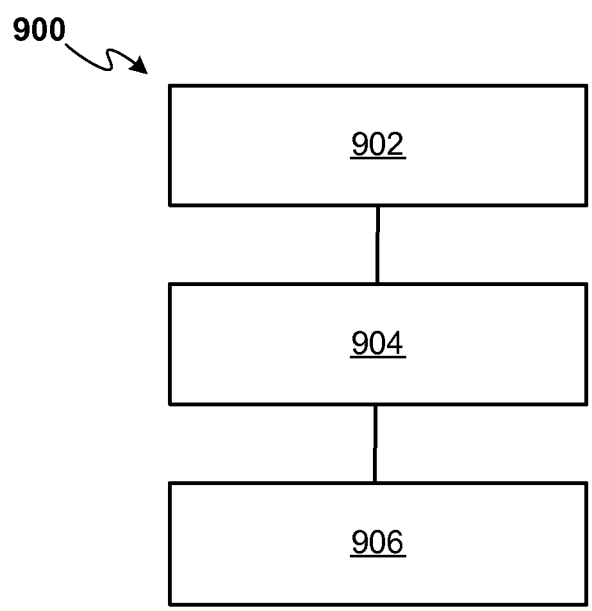
FIG. 9 is a system 900 for manufacturing an integrated circuit in accordance with an embodiment of the present invention.

Referring now to FIG. 9, therein is shown an integrated circuit system 900 for manufacturing an integrated circuit in accordance with an embodiment of the present invention. The system 900 includes: providing a semiconductor substrate in a block 902; forming buried word lines in the semiconductor substrate with the buried word lines including vertical charge-trapping dielectric layers in a block 904; and forming bit lines further comprising forming in-substrate portions in the semiconductor substrate, and forming above-substrate portions over the semiconductor substrate in a block 906.

The present invention allows the storage capacity of a flash memory array to be doubled in density while also providing benefits in the scaling and fabrication of a flash memory array.

Different methods of forming the bit lines and word lines in semiconductor materials including using pre-doped silicon and diffusion of dopant from other materials can also be used without departing from the scope of the present invention.

Various implementations of the system may be used in different electronic devices, and especially the dual bit memory cell architecture may be achieved, according to one or more aspects of the present invention. In particular, the invention is applicable to memory devices wherein multiple bits in a multiple bit cell are used for data or information storage.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hither-to-fore set forth or shown in the accompanying drawings are to be interpreted in an illustrative and non-limiting sense.

The invention claimed is:

1. An integrated circuit system, comprising:
   a semiconductor substrate;
   buried word lines in the semiconductor substrate, the buried word lines including vertical charge-trapping dielectric layers;
   bit lines further comprising:
      in-substrate portions in the semiconductor substrate, and
      above-substrate portions over the semiconductor substrate; and
   conductive channels between the bit lines that are adjacent to the charge-trapping dielectric layers.

2. The system as claimed in claim 1, further comprising the buried word lines and the bit lines connected for single-density or double-density mode operation.

3. The system as claimed in claim 1, wherein the buried word lines further comprise:
   conductive layers on the vertical charge-trapping dielectric layers; and
   top dielectric barrier layers on the conductive layers.

4. The system as claimed in claim 1, wherein the in-substrate portions of the bit lines comprise a dopant in the semiconductor substrate.

5. The system as claimed in claim 1, wherein the buried word lines comprise floating gates therein.

6. An integrated circuit system, comprising:
   a semiconductor substrate;
   a first address line, further comprising:
      a charge-trapping dielectric layer vertically on sidewalls of a trench in the semiconductor substrate,
      a conductive layer on the dielectric layer, and
      a barrier dielectric over the conductive layer;
   second address lines perpendicular to the first address line and partially in the semiconductor substrate to form dual bit locations; and
   conductive channels between the second address lines that are adjacent to the charge-trapping dielectric layer.

7. The system as claimed in claim 6, further comprising:
   first and second additional address lines parallel to the first address line operable therewith to form a plurality of dual bit locations.

8. The system as claimed in claim 6, wherein the first address line further comprises a further barrier layer under the conductive layer.

9. The system as claimed in claim 6, wherein the second address lines each further comprise an in-substrate portion in the semiconductor substrate and an above-substrate portion on the semiconductor substrate in a dielectric layer.

10. The system as claimed in claim 6, further comprising a floating gate on the charge-trapping dielectric layer.

* * * * *